US010991585B2

(12) United States Patent
Thomson et al.

(10) Patent No.: US 10,991,585 B2
(45) Date of Patent: Apr. 27, 2021

(54) TRIMMING OPTICAL DEVICE STRUCTURES

(71) Applicant: UNIVERSITY OF SOUTHAMPTON, Highfield (GB)

(72) Inventors: David John Thomson, Highfield (GB); Graham Trevor Reed, Highfield (GB); Robert Topley, Highfield (GB)

(73) Assignee: University of Southampton, Southampton (GB)

( * ) Notice: Subject to any disclaimer, the term of this patent is extended or adjusted under 35 U.S.C. 154(b) by 0 days.

(21) Appl. No.: 16/072,013

(22) PCT Filed: Jan. 23, 2017

(86) PCT No.: PCT/EP2017/051341
§ 371 (c)(1),
(2) Date: Jul. 23, 2018

(87) PCT Pub. No.: WO2017/125608
PCT Pub. Date: Jul. 27, 2017

(65) Prior Publication Data
US 2019/0035632 A1    Jan. 31, 2019

(30) Foreign Application Priority Data

Jan. 21, 2016  (GB) ...................... 1601165

(51) Int. Cl.
*H01L 21/265*    (2006.01)
*G02B 6/134*     (2006.01)
(Continued)

(52) U.S. Cl.
CPC ...... *H01L 21/26506* (2013.01); *G02B 6/1347* (2013.01); *H01L 21/268* (2013.01);
(Continued)

(58) Field of Classification Search
CPC ............. H01L 21/26506; H01L 21/268; H01L 21/324; H01L 21/67115; H01L 21/67253;
(Continued)

(56) References Cited

U.S. PATENT DOCUMENTS

| 8,852,695 B2 * | 10/2014 | Huang ............... | G02B 6/03666 |
| | | | 427/523 |
| 2003/0044153 A1 * | 3/2003 | Bazylenko ......... | G02B 6/12011 |
| | | | 385/129 |

(Continued)

FOREIGN PATENT DOCUMENTS

JP    200461656    2/2004

OTHER PUBLICATIONS

International Search Report for corresponding Patent Application No. PCT/EP2017/051341 dated May 22, 2017.

*Primary Examiner* — Zandra V Smith
*Assistant Examiner* — Andre C Stevenson
(74) *Attorney, Agent, or Firm* — Renner, Otto, Boisselle & Sklar, LLP

(57) ABSTRACT

A method of trimming the refractive index of material forming at least part of one or more structures integrated in one or more pre-fabricated devices, the method comprising: implanting one or more first regions of material of one or more pre-fabricated devices, encompassing at least partially one or more device structures, with ions to alter the crystal form of the material within the one or more first regions and change the refractive index of the material within the one or more first regions; and heat treating one or more second regions of material of the one or more devices, encompassing at least partially the one or more first regions, to alter the crystal form of the material within the one or more first regions encompassed by the one or more second regions and change the refractive index thereof, thereby trimming the refractive index of the material of at least part of the one or (Continued)

Figure 1:
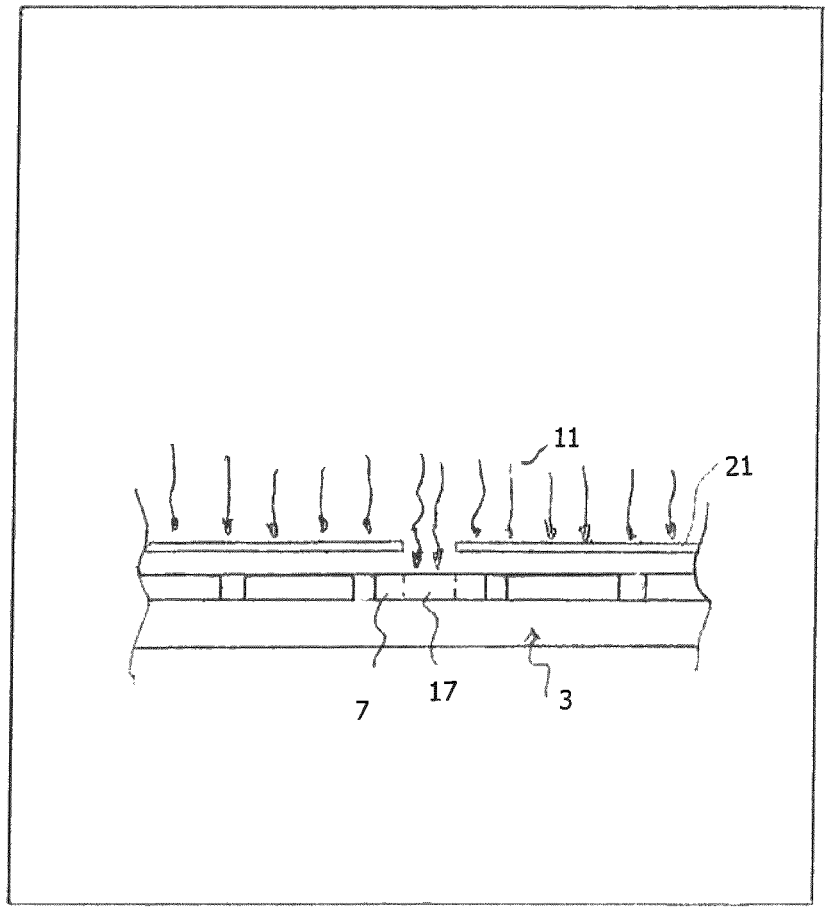

more device structures, such that the one or more device structures provide one or more predetermined device outputs.

20 Claims, 2 Drawing Sheets

(51) Int. Cl.
  *H01L 21/268* (2006.01)
  *H01L 21/324* (2006.01)
  *H01L 21/67* (2006.01)
  *H01L 21/66* (2006.01)
  *G02B 6/12* (2006.01)

(52) U.S. Cl.
  CPC ...... *H01L 21/324* (2013.01); *H01L 21/67115* (2013.01); *H01L 21/67253* (2013.01); *H01L 22/26* (2013.01); *G02B 2006/12171* (2013.01); *G02B 2006/12188* (2013.01)

(58) Field of Classification Search
  CPC .......... H01L 22/26; G02B 2006/12171; G02B 2006/12188
  See application file for complete search history.

(56) References Cited

U.S. PATENT DOCUMENTS

| | | | |
|---|---|---|---|
| 2003/0118271 A1* | 6/2003 | Fujimaki | G02B 6/125 385/15 |
| 2010/0189402 A1* | 7/2010 | Schrauwen | G02B 6/1223 385/129 |
| 2011/0274393 A1* | 11/2011 | Reed | G02B 6/12007 385/37 |
| 2012/0241919 A1* | 9/2012 | Mitani | H01L 21/6835 257/623 |

* cited by examiner

TRIMMING OPTICAL DEVICE STRUCTURES

This application is a national phase of International Application No. PCT/EP2017/051341 filed Jan. 23, 2017 and published in the English language, which claims priority to Great Britain Patent Application No. 1601165.2 filed Jan. 21, 2016, which are hereby incorporated herein by reference.

The present invention relates to a method of trimming the refractive index of at least part of the material of optical device structures, in particular semiconductor devices, for example, wafers and chips implemented in silicon, for example, in resonant structures and in offsetting operating points, such as in a Mach-Zehnder Interferometer (MZI), in order to achieve one or more required device outputs.

Silicon is an attractive optical platform for integration with electronics. However, even the most advanced processing techniques result in variations at both chip and wafer level, and small variations can be catastrophic to the operation of structures. For example, such small variations could provide for the detection of the wrong chemicals in sensors, cross-talk between communications channels or a complete failure to couple between stacked-ring resonators.

The post-fabrication trimming of the refractive index of optical device structures is required in order to enable mass production, by increasing device yield and reducing the per chip cost as a result of having more functional chips.

Current research into the trimming of silicon devices involves the deposition of exotic polymers, such as polymerized hexamethyldisilane, and subsequent UV irradiation. This polymer-based approach may provide a solution, but can only yield a limited change in the refractive index of around 0.04.

The present inventors have instead proposed an entirely-different approach, which provides for the trimming of the refractive index of at least part of the material of optical device structures by locally altering crystal form, in order to cause lattice defects or amorphisation, through ion implantation and subsequent local heat treatment, to adjust the refractive index and therefore trim the device structures. This approach allows for a change in refractive index of up to an order of magnitude greater than the polymer-based approach, and, furthermore, as compared to the polymer-based approach, in being in closer proximity of the optical power, provides for considerably improved performance.

The changing of the refractive index of silicon using ion implantation has previously been disclosed (K. F. Heidemann ("The propagation of light waves through oxygen irradiation induced depth profiles of the complex refractive index in silicon", physica status solidi (a), vol. 68, p. 10, 1981)), but the disclosed technology requires oven annealing, which cannot be performed on pre-fabricated semiconductor devices which incorporate integrated electronic structures.

Local laser annealing has also been disclosed (R. Topley et al ("Locally Erasable Couplers for Optical Device Testing in Silicon on Insulator", Journal of Lightwave Technology. Vol. 32, no. 12, p. 2248, 2014) for removal of erasable gratings.

There has, however, been no recognition of the application of such ion implantation and local heat treatment in conjunction to adjust the refractive index and trim optical device structures.

In one aspect the present invention provides a method of trimming the refractive index of material forming at least part of one or more structures integrated in one or more pre-fabricated devices, the method comprising: implanting one or more first regions of material of one or more pre-fabricated devices, encompassing at least partially one or more device structures, with ions to alter the crystal form of the material within the one or more first regions and change the refractive index of the material within the one or more first regions; and heat treating one or more second regions of material of the one or more devices, encompassing at least partially the one or more first regions, to alter the crystal form of the material within the one or more first regions encompassed by the one or more second regions and change the refractive index thereof, thereby trimming the refractive index of the material of at least part of the one or more device structures, such that the one or more device structures provide one or more predetermined device outputs.

In one embodiment the step of implanting the one or more first regions introduces lattice defects into the material of the one or more first regions.

In one embodiment the step of heat treating the one or more second regions at least partially removes the introduced lattice defects within the material of the one or more first regions, optionally retaining some of the introduced lattice defects.

In one embodiment the one or more second regions overlie substantially entirely the respective ones of the one or more first regions and the step of heat treating the one or more second regions partially removes the introduced lattice defects within the material of the one or more first regions over the substantially the entire areas of the one or more first regions.

In another embodiment the one or more second regions only partially overlie the respective ones of the one or more first regions and the step of heat treating the one or more second regions removes the introduced lattice defects within the material of the one or more first regions over the areas of the one or more second regions, with the introduced lattice defects being substantially retained within the material of the one or more first regions outside of the areas of the one or more second regions.

In one embodiment the step of heat treating the one or more second regions removes entirely the introduced lattice defects within the material of the one or more first regions over the areas of the one or more second regions.

In one embodiment the step of implanting the one or more first regions causes at least partial amorphisation of the material of the one or more first regions.

In one embodiment the step of heat treating the one or more second regions causes at least partial crystallization of the material of the one or more first regions, optionally retaining some of the amorphisation.

In one embodiment the one or more second regions overlie substantially entirely the respective ones of the one or more first regions and the step of heat treating the one or more second regions partially removes the amorphisation within the material of the one or more first regions over the substantially the entire areas of the one or more first regions.

In one embodiment the one or more second regions only partially overlie the respective ones of the one or more first regions and the step of heat treating the one or more second regions removes the amorphisation within the material of the one or more first regions over the areas of the one or more second regions, with the amorphisation being substantially retained within the material of the one or more first regions outside of the areas of the one or more second regions.

In one embodiment the step of heat treating the one or more second regions removes entirely the amorphisation within the material of the one or more first regions over the areas of the one or more second regions.

In one embodiment the step of heat treating comprises at least partially annealing the material of the one or more devices.

In one embodiment the heat treatment is performed using laser power of a laser.

In one embodiment the laser power is delivered via an optical fiber.

In one embodiment the one or more second regions are larger in area than the one or more first regions.

In another embodiment the one or more second regions are smaller in area than the one or more first regions.

In a further embodiment the one or more second regions are substantially of the same area as the one or more first regions.

In one embodiment the one or more devices are on one or more chips.

In another embodiment the one or more devices are on a wafer.

In one embodiment the one or more devices are semiconductor devices.

In one embodiment the semiconductor comprises silicon.

In one embodiment the one or more devices are formed from a material-on-insulator.

In another embodiment the one or more devices are formed from a single crystal.

In one embodiment the ions comprise a single kind of ion.

In another embodiment the ions comprise a plurality of different kinds of ions.

In one embodiment one or more device outputs of the one or more device structures are measured during the heat treatment step.

In one embodiment the heat treating step is controlled in dependence on measured values of the one or more device outputs.

In one embodiment the heat treatment is performed using laser power of a laser, and the laser power is delivered via an optical fiber arrangement by which the one or more device outputs are measured.

In one embodiment the optical fiber arrangement comprises one or more optical fibres affixed to a fiber holding body.

In one embodiment the refractive index of only part of the material of the one or more device structures is changed, optionally less than 50% of the area of the one or more device structures is changed, optionally less than 40%, optionally less than 30%, optionally less than 20%, and optionally less than 10%.

In one embodiment the one or more devices incorporate integrated electronic structures.

The present invention also extends to devices fabricated according to the above-described method.

Figure 2:
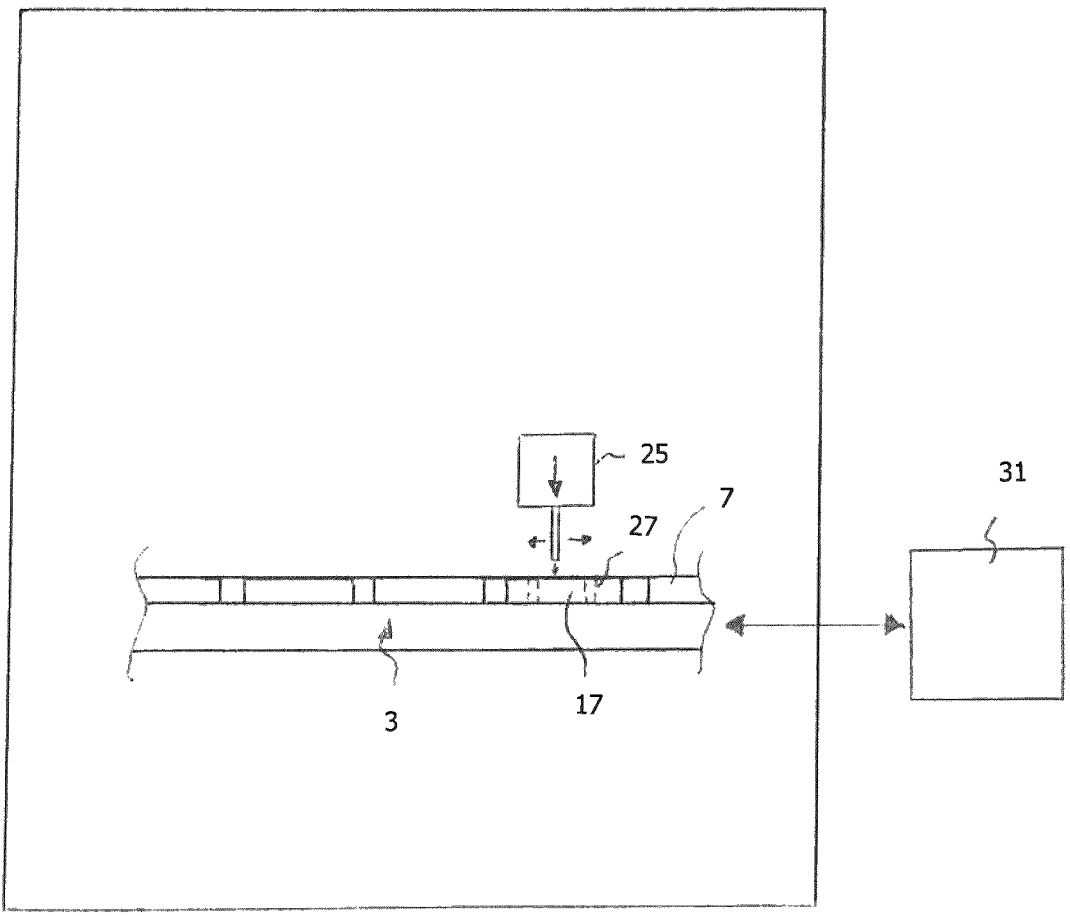

Preferred embodiments of the present invention will now be described hereinbelow by way of example only with reference to the accompanying drawings, in which:

FIG. 1 illustrates ion implantation of a semiconductor wafer as one step in a trimming process in accordance with an embodiment of the present invention; and FIG. 2 illustrates heat treatment of one or more selected regions of a device structure following the ion implantation of FIG. 1.

The trimming of the refractive index of at least part of the material or medium of optical structures formed on pre-fabricated devices, in this embodiment semiconductor devices, incorporating integrated electronic structures will be described.

In a first step, as illustrated in FIG. 1, a semiconductor wafer 3, comprising a plurality of chips 7, is subjected to ion implantation 11.

In this embodiment, one or more regions 17 of one or more chips 7, encompassing at least partially one or more structures provided by the devices on the chips 7, are selectively subjected to ion implantation 11, here by use of a mask 21.

In one alternative embodiment one or more chips 7 or the wafer 3 could entirely be subjected to ion implantation 11.

This ion implantation 11 alters or disrupts the crystal form of the exposed one or more regions 17, in this embodiment by creating lattice defects within the material or amorphisation of the material. By altering the crystal form of the material, the refractive index of the material is altered.

In this embodiment the material is a semiconductor, but could be any other optical material.

In one embodiment the material is silicon, but could be any other semiconductor material, such as germanium.

In another embodiment the material could be an electro-optic material or a ferroelectric material, such as lithium niobate.

In this embodiment the implanted ions are of germanium, but could be of any other kind, such as silicon.

In one embodiment the implanted ions are a single kind of ion.

In another embodiment the implanted ions are combinations of different kinds of ions.

In this embodiment the wafer 3 is a semiconductor-on-insulator wafer.

In an alternative embodiment the wafer 3 could be a single crystal wafer.

In a second step, as illustrated in FIG. 2, following ion implantation, the one or more regions 27 of the one or more chips 7 are subjected to local heat treatment, here using a laser 25 selectively to irradiate the one or more regions 27 of the chips 7, encompassing the one or more structures provided by the devices on the chips 7.

In this embodiment the one or more regions 27 which are heat treated are larger in area than the one or more regions 17 which are irradiated.

In another embodiment the one or more regions 27 which are heat treated could substantially correspond to the one or more regions 17 which are irradiated.

In a further embodiment the one or more regions 27 which are heat treated are smaller in area than the one or more regions 17 which are irradiated.

With this heat treatment, the previously-altered crystal form within the one or more regions 17 is annealed, here partially, such that introduced lattice defects are partially removed and/or amorphous material is at least partially crystallized, causing the refractive index of the material of the one or more regions 17 of the one or more structures to be changed, and in turn causing the one or more structures to be trimmed to have one or more predetermined device outputs, such as resonant frequency for resonant structures. By providing for the ion implantation 11 to alter the crystal form beyond that required to achieve a required refractive index, it is ensured that the refractive index of the material of the one or more regions 17 can be trimmed back to a level required for the one or more device outputs.

In one embodiment the one or more device outputs of the one or more structures on the one or more chips 7 are measured using a measurement system 31 following the heat treatment step which is performed in accordance with a heat treatment protocol, in order to determine the one or more device outputs.

In another embodiment the one or more device outputs of the one or more structures on the one or more chips 7 are measured using a measurement system 31 during the heat treatment step, in order to monitor the one or more device outputs and/or allow for control of the heat treatment to achieve the one or more device outputs.

In one embodiment the laser 25 provides radiation having a wavelength of from about 190 nm to about 1700 nm, but could be of other wavelength. In this embodiment the wavelength can be selected in accordance with the depth of the lattice defects and/or amorphisation, and the required penetration depth.

In one embodiment the refractive index of only part of the material of the one or more device structures is changed, optionally less than 50% of the area of the one or more device structures is changed, optionally less than 40%, optionally less than 30%, optionally less than 20%, and optionally less than 10%.

Finally, it will be understood that the present invention has been described in its preferred embodiments and can be modified in many different ways without departing from the scope of the invention as defined by the appended claims.

The invention claimed is:

1. A method of trimming the refractive index of material forming at least part of one or more structures integrated in one or more pre-fabricated devices, the method comprising:
    implanting one or more first regions of material of one or more pre-fabricated devices, encompassing at least partially one or more device structures, with ions to alter the crystal form of the material within the one or more first regions and change the refractive index of the material within the one or more first regions; and
    heat treating one or more second regions of material of the one or more devices, encompassing at least partially the one or more first regions, to alter the crystal form of the material within the one or more first regions encompassed by the one or more second regions and change the refractive index thereof, thereby trimming the refractive index of the material of at least part of the one or more device structures, such that the one or more device structures provide one or more predetermined device outputs.

2. The method of claim 1, wherein the step of implanting the one or more first regions introduces lattice defects into the material of the one or more first regions.

3. The method of claim 2, wherein the step of heat treating the one or more second regions at least partially removes the introduced lattice defects within the material of the one or more first regions, optionally retaining some of the introduced lattice defects.

4. The method of claim 3, wherein the one or more second regions overlie entirely the respective ones of the one or more first regions and the step of heat treating the one or more second regions partially removes the introduced lattice defects within the material of the one or more first regions over the entire areas of the one or more first regions.

5. The method of claim 3, wherein the one or more second regions only partially overlie the respective ones of the one or more first regions and the step of heat treating the one or more second regions removes the introduced lattice defects within the material of the one or more first regions over the areas of the one or more second regions, with the introduced lattice defects being retained within the material of the one or more first regions outside of the areas of the one or more second regions.

6. The method of claim 5, wherein the step of heat treating the one or more second regions removes entirely the introduced lattice defects within the material of the one or more first regions over the areas of the one or more second regions.

7. The method of claim 1, wherein the step of implanting the one or more first regions causes at least partial amorphisation of the material of the one or more first regions.

8. The method of claim 7, wherein the step of heat treating the one or more second regions causes at least partial crystallization of the material of the one or more first regions, optionally retaining some of the amorphisation.

9. The method of claim 8, wherein the one or more second regions overlie entirely the respective ones of the one or more first regions and the step of heat treating the one or more second regions partially removes the amorphisation within the material of the one or more first regions over the entire areas of the one or more first regions.

10. The method of claim 8, wherein the one or more second regions only partially overlie the respective ones of the one or more first regions and the step of heat treating the one or more second regions removes the amorphisation within the material of the one or more first regions over the areas of the one or more second regions, with the amorphisation being retained within the material of the one or more first regions outside of the areas of the one or more second regions.

11. The method of claim 10, wherein the step of heat treating the one or more second regions removes entirely the amorphisation within the material of the one or more first regions over the areas of the one or more second regions.

12. The method of claim 1, wherein the step of heat treating comprises at least annealing the material of the one or more devices.

13. The method of claim 1, wherein the one or more devices are formed from a material-on-insulator.

14. The method of claim 1, wherein the one or more devices are formed from a single crystal.

15. The method of claim 1, wherein one or more device outputs of the one or more device structures are measured during the step of heat treating.

16. The method of claim 15, wherein the step of heat treating is controlled in dependence on measured values of the one or more device outputs.

17. The method of claim 15, wherein the step of heat treating is performed using laser power of a laser, and the laser power is delivered via an optical fiber arrangement by which the one or more device outputs are measured.

18. The method of claim 17, wherein the optical fiber arrangement comprises one or more optical fibres affixed to a fiber holding body.

19. The method of claim 1, wherein the refractive index of only part of the material of the one or more device structures is changed, optionally less than 50% of the area of the one or more device structures is changed, optionally less than 40%, optionally less than 30%, optionally less than 20%, and optionally less than 10%.

20. A device fabricated according to the method of claim 1.

* * * * *